US011527422B2

(12) United States Patent
Sekine et al.

(10) Patent No.: US 11,527,422 B2
(45) Date of Patent: Dec. 13, 2022

(54) EXHAUST GAS PROCESSING APPARATUS

(71) Applicant: EBARA CORPORATION, Tokyo (JP)

(72) Inventors: Takafumi Sekine, Tokyo (JP);
Takanori Inada, Tokyo (JP);
Kazutomo Miyazaki, Tokyo (JP);
Naoya Hanafusa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 290 days.

(21) Appl. No.: 16/983,285

(22) Filed: Aug. 3, 2020

(65) Prior Publication Data
US 2021/0057236 A1 Feb. 25, 2021

(30) Foreign Application Priority Data

Aug. 22, 2019 (JP) .............................. JP2019-152118

(51) Int. Cl.
| | | |
|---|---|---|
| *B01D 47/02* | (2006.01) | |
| *B01D 47/06* | (2006.01) | |
| *B01D 53/68* | (2006.01) | |
| *B01D 53/78* | (2006.01) | |
| *H01L 21/67* | (2006.01) | |

(52) U.S. Cl.
CPC ...... *H01L 21/67017* (2013.01); *B01D 47/022* (2013.01); *B01D 47/06* (2013.01); *B01D 53/68* (2013.01); *B01D 53/78* (2013.01); *B01D 2257/204* (2013.01)

(58) Field of Classification Search
CPC .............. B01D 2252/103; B01D 47/10; B01D 53/185; B01D 47/022; B01D 2247/04; B01D 2257/553; B01D 53/68; B01D 47/06; B01D 2257/204; B01D 47/12; B01D 53/78; B01D 2247/10; H01L 21/67017
See application file for complete search history.

(56) References Cited

U.S. PATENT DOCUMENTS

| | | | | |
|---|---|---|---|---|
| 5,649,985 | A | * | 7/1997 | Imamura ................ B01D 53/58 96/275 |
| 2003/0164560 | A1 | | 9/2003 | Okuda et al. |
| 2014/0366958 | A1 | | 12/2014 | Miyazaki et al. |
| 2019/0262760 | A1 | | 8/2019 | Inada et al. |

FOREIGN PATENT DOCUMENTS

| | | |
|---|---|---|
| JP | 2003-251130 A | 9/2003 |
| JP | 2015-000379 A | 1/2015 |
| JP | 2019-147074 A | 9/2019 |

* cited by examiner

*Primary Examiner* — Timothy C Vanoy
(74) *Attorney, Agent, or Firm* — Pearne & Gordon LLP

(57) ABSTRACT

There is provided an exhaust gas processing apparatus configured to cause a processing gas to be exposed to or come into contact with a liquid and thereby detoxify the processing gas. The exhaust gas processing apparatus comprises a suction casing provided with an inlet which the processing gas is sucked into and with an outlet which the processing gas is flowed out from; a liquid tank configured to receive an outlet-side part of the suction casing and store the liquid therein; and one or multiple spray nozzles placed in the liquid tank. The outlet of the suction casing is arranged to be located above a liquid surface of the liquid stored in the liquid tank. The one or multiple spray nozzles are configured to spray the liquid from around the outlet of the suction casing to a peripheral part of the outlet.

16 Claims, 8 Drawing Sheets

EXHAUST GAS PROCESSING APPARATUS

TECHNICAL FIELD

The present disclosure relates to an exhaust gas processing apparatus and more specifically relates to an exhaust gas processing apparatus configured to cause a processing gas to be exposed to or come into contact with a liquid and thereby detoxify the processing gas.

BACKGROUND ART

A vacuum pump apparatus is widely used as one of manufacturing equipment of, for example, semiconductors, liquid crystals, solar panels or LEDs. In a manufacturing process or the like, a vacuum pump is connected with a vacuum chamber, and a processing gas introduced into the vacuum chamber is sucked under vacuum by the vacuum pump. The gas sucked under vacuum by the vacuum pump may contain a toxic combustible gas, such as silane gas ($SiH_4$), dichlorosilane gas ($SiH_2Cl_2$) or ammonia ($NH_3$), or a halogen-based refractory gas, such as $NF_3$, $ClF_3$, $SF_6$, $CHF_3$, $C_2F_6$ or $CF_4$, and is not allowed to be directly released to the atmosphere. In the vacuum pump apparatus, a detoxifying apparatus (exhaust gas abatement equipment) configured to detoxify the gas sucked under vacuum (one example of the exhaust gas processing apparatus) is thus generally provided after the vacuum pump. Known techniques of detoxifying the gas include, for example, a wet type that causes the processing gas to be exposed to or come into contact with a liquid, so as to remove foreign substance, water-soluble components and the like and a combustion type that combusts the processing gas.

The processing gas discharged from the vacuum pump may include a substance solidified by a reaction or the like in the vacuum chamber or a substance that is easily solidified as a reaction byproduct. Such a product entering the detoxifying apparatus is likely to cause a piping and the detoxifying apparatus to be clogged or to reduce the processing efficiency of the detoxifying apparatus. Accordingly, a foreign substance removal mechanism (one example of the exhaust gas processing apparatus) may be provided between the vacuum pump apparatus and the detoxifying apparatus to remove foreign sub stance.

For example, a filter or a trap may be used for the foreign substance removal mechanism. The filter or the trap can remove the foreign substance by the simple structure but requires regular maintenance, for example, replacement of the filter. Another known example of the foreign substance removal mechanism is a fan scrubber including a fan configured to stir a gas, a motor configured to drive the fan, and a nozzle configured to inject a liquid. The fan scrubber traps the foreign substance by the liquid injected from the nozzle. The fan scrubber serves not only as the foreign substance removal mechanism but as the exhaust gas processing apparatus.

In the conventional foreign substance removal mechanism or detoxifying apparatus, however, the foreign substance is likely to be accumulated in a piping or the like on the upstream side of the portion in which the function of the mechanism or the apparatus is exerted. A technique employed to prevent such accumulation of the foreign substance in the piping may heat the piping, may form a wet wall (liquid surface) in the piping or may mechanically scrape off the foreign substance with a scraper or the like. In the case of heating the piping, it is desirable to heat the piping to high temperature of, for example, 150° C. or higher. In the wet-type detoxifying apparatus, however, the temperature of the piping is likely to be lowered by the liquid in the vicinity of an area where the liquid is supplied and is likely to cause accumulation of the foreign substance in the vicinity of the area. In the case of forming the wet wall, foreign substance such as condensable product may be accumulated on an upstream side of the wet wall, or a reaction product of a water-soluble gas such as dichlorosilane ($SiH_2Cl_2$) and water may be accumulated in a liquid supply portion configured to form the wet wall. The product reacting with water may generate an incomplete reactant in an unstable state, more specifically a siloxane mixture that has high reactivity and that generates hydrogen. In the case of removing the foreign substance with the scraper or the like in the vicinity of the area where the liquid is supplied, as is known, there is a possibility of firing caused by the friction-generated static electricity as the ignition source.

The foreign substance removal mechanism or the detoxifying apparatus may be provided with a circulation tank where a liquid used in the mechanism or the apparatus is stored for circulation and reuse. In this case, the processing gas is likely to react with the liquid in the circulation tank to produce a product, and the product is likely to adhere to a piping to the circulation tank and/or a wall surface of the circulation tank. Accordingly, for the purpose of preventing a failure of the mechanism or the apparatus and/or maintaining the processing efficiency of the mechanism or the apparatus, there is a need to stop the mechanism or the apparatus and perform maintenance for removal of the product at regular intervals.

RELATED ART DOCUMENT

Patent Document

Patent Document 1: Japanese Unexamined Patent Publication No. 2003-251130
Patent Document 2: Japanese Unexamined Patent Publication No. 2015-379

SUMMARY OF INVENTION

In order to solve at least part of the problems described above, the applicant has filed Japanese Patent Application No 2018-031823 to propose a configuration that a heater is embedded inside of a wall portion above a liquid film forming portion provided to form a liquid film on an inner wall surface of a suction casing in an exhaust gas processing apparatus. This configuration heats the suction casing up to the periphery of the inner wall surface where the liquid film is formed and thereby suppresses accumulation of foreign substance in the pathway of the processing gas.

An object of the present disclosure is to solve at least part of the problems described above and/or to further improve the configuration of the prior application.

According to one aspect of the present disclosure, there is provided an exhaust gas processing apparatus configured to cause a processing gas to be exposed to or come into contact with a liquid and thereby detoxify the processing gas. The exhaust gas processing apparatus comprises a suction casing provided with an inlet which the processing gas is sucked into and with an outlet which the processing gas is flowed out from; a liquid tank configured to receive an outlet-side part of the suction casing and store the liquid therein; and one or multiple spray nozzles placed in the liquid tank. The outlet of the suction casing is arranged to be located above a liquid surface of the liquid stored in the liquid tank. The one or multiple spray nozzles are configured to spray the liquid from around the outlet of the suction casing to a peripheral part of the outlet.

According to another aspect of the present disclosure, there is provided an exhaust gas processing apparatus configured to cause a processing gas to be exposed to or come into contact with a liquid and thereby detoxify the processing gas. The exhaust gas processing apparatus comprises a suction casing provided with an inlet which the processing gas is sucked into and with an outlet which is provided below the inlet and which the processing gas is flowed out from; a liquid tank configured to receive an outlet-side part of the suction casing and store the liquid therein; a liquid film forming portion provided between the inlet and the outlet of the suction casing and configured to form a liquid film on an inner wall surface of the suction casing; and one or multiple liquid supply devices placed in the liquid tank and configured to inject or spray the liquid. The suction casing is arranged such that a terminal end of the suction casing is located below a liquid surface of the liquid in the liquid tank. The suction casing is provided with the outlet in a side wall on a terminal end side of the suction casing. A duct is provided in the liquid tank to guide the processing gas from the outlet of the suction casing toward a downstream side. The one or multiple liquid supply devices are arranged to inject or spray the liquid toward inside of the duct and a wall surface of the duct.

DESCRIPTION OF EMBODIMENTS

Figure 1:
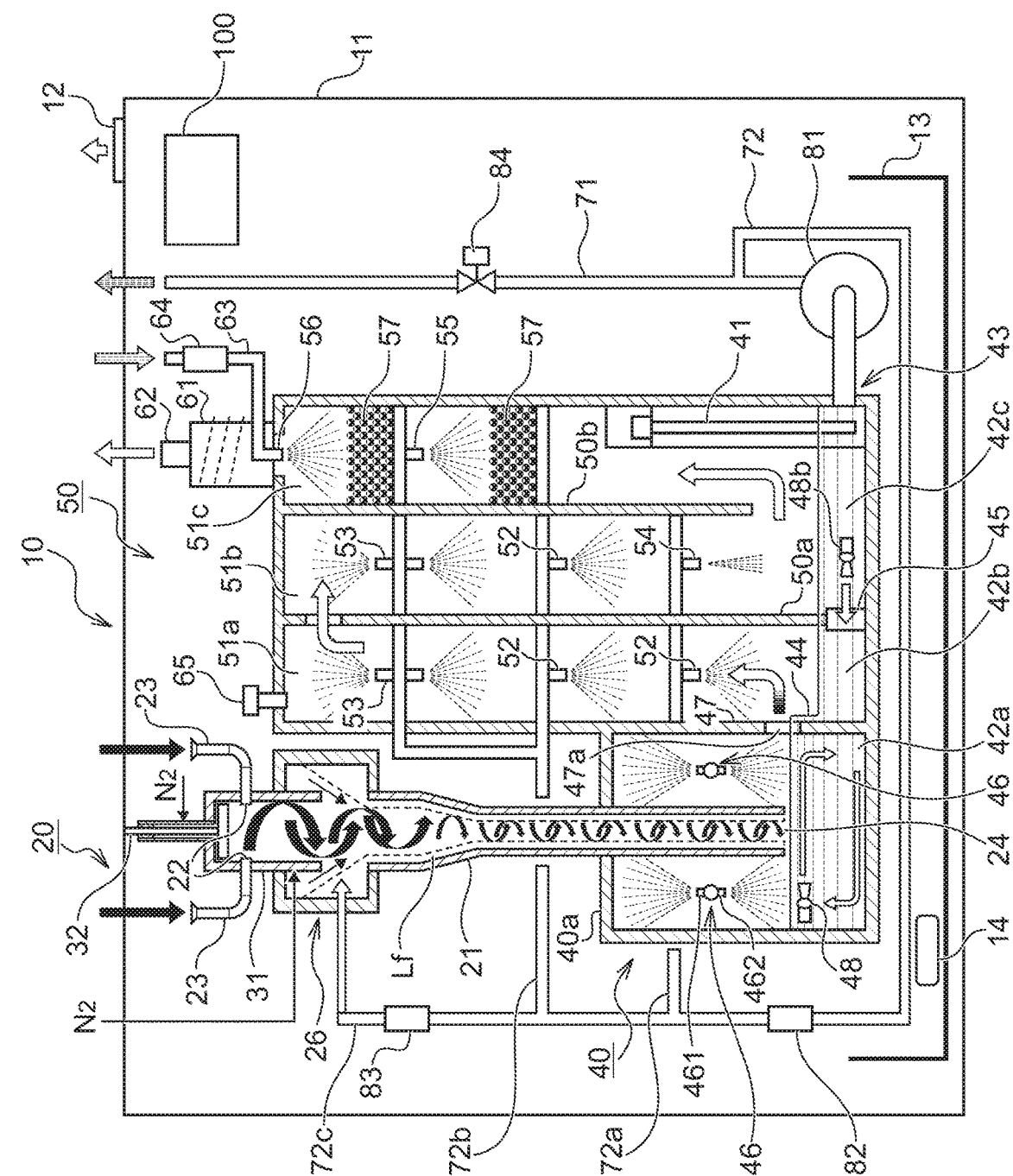
FIG. 1 is a diagram illustrating the schematic configuration of an exhaust gas processing apparatus according to a first embodiment.

The following describes embodiments of the present disclosure with reference to drawings. In the drawings described below, similar or equivalent components are expressed by similar reference signs with omission of overlapping description. An exhaust gas processing apparatus according to an embodiment is configured as a wet-type exhaust gas processing apparatus to cause a processing gas to be exposed to or come into contact with a liquid and thereby detoxify the processing gas and may be used as one of manufacturing equipment of, for example, semiconductors, liquid crystals, solar panels or LEDs.

First Embodiment

FIG. 1 is a diagram illustrating the schematic configuration of an exhaust gas processing apparatus (exhaust gas abatement equipment) according to a first embodiment. This exhaust gas processing apparatus 10 is provided to detoxify a gas (processing gas) from a vacuum pump and is connected with a non-illustrated vacuum pump on a primary side (upstream side). The exhaust gas processing apparatus of this embodiment may be used alone for detoxifying the gas from the vacuum pump or may be used along with another exhaust gas processing apparatus such as a combustion-type apparatus (for example, a detoxifying apparatus). For example, when a gas to be removed, which is included in a gas sucked under vacuum by a vacuum pump is entirely a water-soluble component, the exhaust gas processing apparatus 10 may be used alone. When the exhaust gas processing apparatus 10 is used along with another exhaust gas processing apparatus, it is preferable to connect another exhaust gas processing apparatus after the exhaust gas processing apparatus 10.

As shown in FIG. 1, the exhaust gas processing apparatus 10 includes a suction casing 20 configured to suck the processing gas from the non-illustrated vacuum pump, a liquid tank casing (circulating water tank casing) 40 connected with the suction casing 20, and a processing casing (reactor) 50 connected with the liquid tank casing 40. The liquid tank casing 40 and the processing casing 50 may be provided as an integrated casing. The processing gas sucked into the suction casing 20 passes through and is processed in the liquid tank casing 40 and the processing casing 50 and is then discharged outside or is subsequently introduced into another exhaust gas processing apparatus. The suction casing 20, the liquid tank casing 40 and the processing casing 50 are placed in a cabinet 11, and a drain pan 13 is provided on a bottom of the cabinet 11. The drain pan 13 is provided with a liquid leakage sensor (water leak sensor) 14 configured to detect the moisture and thereby monitor a leakage of liquid from the structure in the apparatus.

A controller (control panel) 100 is provided to control the respective components of the exhaust gas processing apparatus 10. The controller 100 includes, for example, a memory configured to store a variety of set data and a variety of programs therein and a CPU configured to execute the programs in the memory. A storage medium constituting the memory may include a volatile storage medium and/or a non-volatile storage medium. The storage medium may include one or a plurality of any storage media, for example, a ROM, a RAM, a flash memory, a hard disk, a CD-ROM, a DVD-ROM, and a flexible disk. The controller 100 may include the memory, the CPU, a sequencer and/or an application specific integrated circuit. Part or the entirety of the configuration of the controller 100 may be intensively or dispersedly placed inside and/or outside of the exhaust gas processing apparatus 10.

The suction casing 20 according to this embodiment is formed in a cylindrical shape as a whole. The shape of the suction casing 20 is not limited to the cylindrical shape but may be any arbitrary shape. A lower end side (terminal end side) of the suction casing 20 is placed in the liquid tank casing 40. An opening at a lower end of the suction casing 20 forms an outlet 24 through which the processing gas is led out from the suction casing 20 into the liquid tank casing 40. An inlet 22 is formed in the vicinity of an upper end of the suction casing 20 to be connected with the non-illustrated vacuum pump via a suction piping (inlet pipeing) 23. The processing gas sucked from the inlet 22 into the suction casing 20 is guided through the outlet 24 into the liquid tank casing 40. The suction piping 23 arranged from the inlet 22 to the vacuum pump may be provided with a piping heater (not shown). The piping heater is configured to heat the suction piping 23 to a predetermined temperature (for example, 180° C.) when the processing gas flows in the suction piping 23, and a jacket heater or any of various other heaters may be employed for the piping heater. This piping heater serves to suppress any foreign substance from being accumulated in the suction piping 23 and in the inlet 22. A pressure gauge configured to measure the pressure of the processing gas may be provided in a gas flow path of the suction casing 20 (for example, the inlet 22 or the suction piping 23) to monitor blockage or non-blockage of the piping.

A liquid film forming portion (water wall forming section) 26 is provided between the inlet 22 and the outlet 24 of the suction casing 20 to form a liquid film (wet wall) Lf on an inner wall surface of the suction casing 20. The liquid film forming portion 26 according to the embodiment is provided along the entire circumference in a circumferential direction of the ring-shaped suction casing 20. Accordingly, the suction casing 20 is parted into a wall portion (piping) 31 above the liquid film forming portion 26 and a wall portion (piping) 21 below the liquid film forming portion 26. Forming the liquid film Lf on the inner wall surface by the liquid film forming portion 26 causes foreign substance to be flowed out by the liquid film in the vicinity of the inner wall surface of the piping 21 and thereby suppresses the foreign substance such as reaction byproduct from being accumulated in the piping 21. In the description below, the reaction byproduct is simply called the product. In one example, when the processing gas includes dichlorosilane gas, dichlorosilane reacts with water to produce SiO2 (water-soluble component) as the product.

In another example, when the processing gas includes dichlorosilane and ammonia, dichlorosilane and ammonia react with each other to produce NH4Cl. This reaction is more likely to proceed at low temperatures. It is accordingly preferable to heat the flow path of the gas and/or the liquid by a heater or the like.

It is preferable to supply a purge gas to an upper end portion of the liquid film Lf formed by the liquid film forming portion 26 and its periphery. An inert gas such as nitrogen may be used as the purge gas. It is also preferable to heat the supplied purge gas to a predetermined temperature (for example, 180° C.). FIG. 1 illustrates an example of supplying N2 gas as the purge gas to the upper end portion of the liquid film Lf and its periphery. This configuration suppresses the product from adhering to the exposed wall surface of the suction casing 20 in the vicinity of the liquid film forming portion 26 or more specifically in the upper end portion of the liquid film Lf and its periphery.

According to the embodiment, a cartridge heater (not shown) is embedded in the wall portion 31 above the liquid film forming portion 26 in the suction casing 20 to heat the wall portion 31 to a predetermined temperature (for example, 180° C.). Embedding the cartridge heater in the wall portion 31 enables the wall portion 31 to be heated suitably up to the liquid film forming portion 26 and prevents the foreign substance from being accumulated in the vicinity of the liquid film forming portion 26. Directly heating the wall portion 31 by using the cartridge heater embedded inside thereof enables the wall portion 31 to be heated more efficiently and saves energy, compared with heating by a jacket heater. Additionally, the cartridge heater is generally less expensive than the jacket heater and thereby reduces the cost. A configuration of inserting and placing the cartridge heater in a detachable manner in a hole formed in the wall portion 31 facilitates maintenance and replacement of the cartridge heater.

According to the embodiment, a scraper 32 is provided at an upper end of the wall portion 31. The scraper 32 is operated continuously or occasionally to mechanically scrape off the product adhering to the inner wall surface of the wall portion 31 and thereby suppresses the product from adhering to the inner wall surface of the wall portion 31. A guide portion is also provided at the upper end of the wall portion 31 to guide a shaft of the scraper 32, and the purge gas (N2 gas in the example of FIG. 1) is introduced into the guide portion. This configuration suppresses the product from adhering to the shaft of the scraper 32 and its periphery and prevents the operation of the scraper 32 from being interfered.

As shown in FIG. 1, a lower end side of the suction casing 20 is placed inside of the liquid tank casing 40, and the outlet 24 of the suction casing 20 is opened in the liquid tank casing 40. The liquid tank casing 40 is configured as a circulation tank to store a liquid therein and reuse the stored liquid for the processing of the exhaust gas processing apparatus 10. The liquid tank casing 40 includes a liquid tank (circulating water tank) 42a, and for example, a liquid flowed as the liquid film Lf flows down into this liquid tank 42a. The liquid tank 42a has a weir 44 provided on a downstream side, i.e., on a processing casing 50-side of the outlet 24 of the suction casing 20. A liquid tank (circulating water tank) 42b and a liquid tank (circulating water tank) 42c provided in a lower part in the processing casing 50 are placed on a downstream side of the weir 44. A filter 45 is placed between the liquid tank 42b and the liquid tank 42c.

The liquid flowing down from the outlet 24 of the suction casing 20 once enters the liquid tank 42a. The liquid stored in the liquid tank 42a flows over the weir 44, flows into the liquid tank 42b, passes through the filter 45 and flows into the liquid tank 42c. The liquid tank 42c is provided with a liquid outlet (drain port) 43. The liquid in the liquid tank 42c is discharged from the liquid outlet 43.

According to a modified configuration, the liquid tank casing 40 may be provided with the liquid tanks 42a to 42c, and the processing casing 50 may be connected above the liquid tanks 42b and 42c.

According to the embodiment, the suction casing 20 has such a length as to be in proximity to the liquid surface of the liquid stored in the liquid tank 42a. In other words, the outlet 24 is arranged to be close to the liquid surface of the liquid stored in the liquid tank 42a but to be separate from the liquid surface. In one example, a distance between the outlet 24 and the liquid surface is, for example, about 20 mm to 30 mm. The distance between the outlet 24 and the liquid surface is selected to sufficiently reduce a pressure (pressure loss) applied by the liquid onto the processing gas discharged from the outlet 24 and to suppress scattering of the product from the vicinity of the outlet 24. In this configuration, there is a clearance between the outlet 24 of the suction casing 20 and the liquid surface. This configuration reduces a pressure loss provided by the stored liquid onto the processing gas flowing out from the outlet 24. Furthermore, the outlet 24 is arranged close to the liquid surface of the stored liquid. This configuration suppresses scattering of the product to the periphery. As described later, an overflow-type liquid tank is employed for the liquid tank 42a. In one example, a fluctuation of the liquid surface is limited in a range of several mm. Accordingly, by taking into account the fluctuation of the liquid surface, it is preferable to place the outlet 24 above an upper end of the weir 44, such that the outlet 24 is continuously located above the liquid surface at a distance of about 20 mm to 30 mm. For example, when the liquid surface has a fluctuation of 5 mm, the outlet 24 may be placed above the upper end of the weir 44 at a distance of about 25 mm to 35 mm with a margin for the fluctuation of the liquid surface.

The liquid tank 42a includes a wall 40a provided to surround an upper side, a lower side and a lateral side; and a wall 47 provided to part the liquid tank 42a and the liquid tank 42b from each other. The wall 47 is provided with an opening 47a to make the liquid tank 42a and the liquid tank 42b communicate with each other, and a lower part of the wall 47 below the opening 47a forms the weir 44. The liquid tank 42a is configured as an overflow-type liquid tank to cause the stored liquid to be flowed over the weir 44 and flowed into the liquid tank 42b and to stably keep the liquid surface of the liquid in the liquid tank 42a. In one example, the fluctuation of the liquid surface is limited in the range of several mm. This configuration stabilizes the height of the liquid surface immediately below the outlet 24 and suppresses an increase in pressure loss of the processing gas and scattering of the product.

The liquid tank 42a is provided with one or multiple spray nozzles 46. In this illustrated example, a plurality of spray nozzles 46 are provided and are arranged at equal intervals around the piping 21 of the suction casing 20. FIG. 1 illustrates two spray nozzles 46, but the number of the spray nozzles 46 may be three or more. The number of the spray nozzles 46 is selected such that the liquid is sprayed over the entire inside of the liquid tank 42a (the entire configuration above the liquid surface) to provide no interface or surface of the apparatus configuration that is exposed on the outside of the liquid in the liquid tank 42a. The configuration above the liquid surface includes the wall of the liquid tank 42a and an outer surface of the piping 21 of the suction casing 20.

The respective spray nozzles 46 are arranged on the lateral side of the suction casing 20 and above the outlet 24. Each of the spray nozzles 46 is configured to be in fluid connection with a fluid flow path (water flow path) 72a and to receive a supply of the liquid from the fluid flow path 72a. Each of the spray nozzles 46 includes a first spray nozzle 461 provided to spray the liquid upward and a second spray nozzle 462 provided to spray the liquid downward. The first spray nozzle 461 is configured to spray and sprinkle the liquid upward in the liquid tank 42a and cover the wall of the liquid tank 42a and an outer surface of the suction casing 20 with the liquid. The second spray nozzle 462 is configured to spray and sprinkle the liquid in the liquid tank 42a to a part in the periphery of the outlet 24 at the lower end of the suction casing 20. The second spray nozzle 462 may be configured to spray and sprinkle the liquid further onto the wall of the liquid tank 42a.

Spraying the liquid from each of the spray nozzles 46 causes the processing gas introduced into the liquid tank 42a to be exposed to or come into contact with the liquid and to be thereby hydrolyzed and causes the product produced by the hydrolysis to be hit down into the stored liquid by the sprayed liquid. This configuration suppresses the product from floating in the liquid tank casing 40.

Spraying the liquid from the respective spray nozzles 46 into the entire liquid tank 42 enables the entire inside of the liquid tank 42a (the walls of the liquid tank 42a and the suction casing 20) to be covered with the liquid. This enables the entire interface, which is likely to cause adhesion of the product, to be covered with the liquid film and suppresses adhesion of the product onto the wall surface of the liquid tank 42a and the suction casing 20. The first spray nozzle 461 sprays the liquid upward, so that the ceiling portion of the liquid tank casing 40 is also effectively covered with the liquid.

Furthermore, the second spray nozzle 462 is configured to spray the liquid from around the outlet 24 of the suction casing 20 to the peripheral part of the outlet 24, so that the product produced by the reaction of the processing gas with the liquid in the vicinity of the outlet 24 of the suction casing 20 is dropped down into the stored liquid. This configuration further suppresses scattering of the product from the vicinity of the outlet 24 of the suction casing 20.

In FIG. 1, an eductor 48 is placed in the liquid tank 42a. The eductor 48 is a device driven by a driving fluid to suck an amount of the liquid several times as much as the amount of the driving fluid and discharge the sucked liquid along with the driving fluid. The eductor 48 is placed in the stored liquid at a position close to the liquid surface in the liquid tank 42a and is directed to suck the stored liquid and discharge the liquid toward a downstream side (liquid tank 42b-side). The stored liquid in the liquid tank 42a is stirred by the suction and the discharge of the liquid by the eductor 48. Stirring the stored liquid by the eductor 48 causes the product contained in the stored liquid to be dissolved in the stored liquid and suppresses the product from being retained or floating in the stored liquid. The eductor 48 is configured to, for example, receive a supply of the driving fluid from the fluid flow path 72a, suck the stored liquid and discharge the sucked liquid along with the driving fluid.

Figure 8:
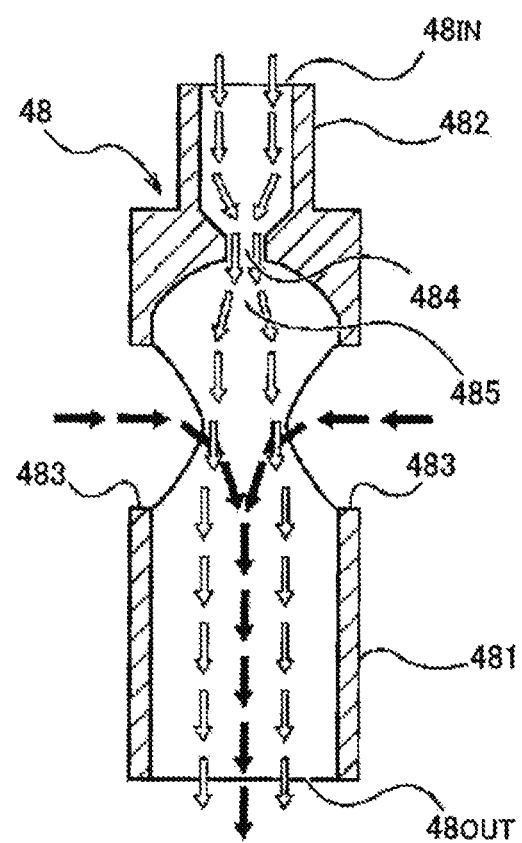
FIG. 8 is a diagram illustrating operation of an eductor.

FIG. 8 is a diagram illustrating the operation of the eductor 48. The flow of a driving fluid supplied from a water supply port 48IN of a water supply portion 482 is restricted by a nozzle 484 as shown by open arrows and is released at a high speed into a diffusion chamber 485. The high speed flow decreases the pressure in the diffusion chamber 485 and causes a liquid in a liquid tank 42 to be sucked from two suction ports 483, 483 into the diffusion chamber 485 as shown by closed arrows. The liquid sucked from the suction ports 483, 483 into the diffusion chamber 485 is discharged from a discharge port 48OUT along with the driving fluid flowed in from the water supply portion 482. In this case, when an amount Q of water is supplied from the water supply portion 482, the amount of water sucked from the two suction ports 483, 483 is about 4Q. A total amount 5Q of the liquid is accordingly injected from the eductor 48.

The processing casing 50 is connected with the liquid tank casing 40 and is configured to further detoxify the processing gas flowing in from the liquid tank casing 40 and discharge the detoxified processing gas. The processing casing 50 includes a shower tank 51a, a shower tank 51b and a shower tank 51c. The shower tank 51a and the shower tank 51b are parted from each other by a wall 50a, and the shower tank 51b and the shower tank 51c are parted from each other by a wall 50b. According to the embodiment, the liquid tank 42b and the liquid tank 42c are respectively provided below the shower tank 51a and the shower tank 51b.

The liquid tank 42b is parted from the liquid tank 42a by the wall 47 and is configured such that the liquid flowing over the weir 44 below the opening 47a of the wall 47 is flowed into the liquid tank 42b. A downstream side of the liquid tank 42b is parted from the liquid tank 42c by the wall 50a, and the liquid in the liquid tank 42b is flowed into the liquid tank 42c via the filter 45 provided in an opening of the wall 50a.

The liquid tank 42c is parted from the liquid tank 42b by the wall 50a and is located on the downstream side of the liquid tank 42b. The liquid from the liquid tank 42b is flowed into the liquid tank 42c after removal of the foreign substance such as the product by the filter 45. An eductor 48b is placed in the liquid tank 42c. The eductor 48b is directed to discharge the liquid toward the filter 45. Discharging the liquid by the eductor 48b suppresses the filter 45 from being clogged. The liquid tank 42c is provided with a water level gauge (water level sensor) 41. By using a detection value of the water level gauge 41, the water level in the liquid tank 42c is controlled to be in a predetermined range (a range of not less than a predetermined first reference value and less than a predetermined second reference value) by means of a pump 81 and/or a drain valve 84 described later.

The shower tank 51a on a first stage includes two spray nozzles 52 placed to be aligned vertically and a spray nozzle or injection nozzle 53 placed above the spray nozzles 52. The spray nozzles 52 are configured to receive a supply of the liquid from a fluid flow path (water flow path) 72b and spray the supplied liquid downward. The spray nozzle or injection nozzle 53 is configured to receive a supply of the liquid from the fluid flow path 72b and spray the liquid both downward and upward. The processing gas from the liquid tank 42a is flowed upward in the shower tank 51a and is flowed from the vicinity of an upper end portion of the shower tank 51a into the shower tank 51b on a second stage. While the processing gas passes through the shower tank 51a, the processing gas is exposed to or comes into contact with the liquid sprayed from the spray nozzles 52, 52 and from the spray nozzle or injection nozzle 53, so as to be hydrolyzed. An overpressure exhaust port 65 is provided in an upper portion of the shower tank 51a. The overpressure exhaust port 65 serves to release the pressure in the tank when an excess pressure is applied in the tank.

The shower tank 51b on the second stage includes a spray nozzle or injection nozzle 53, a spray nozzle 52 placed below the spray nozzle or injection nozzle 53, and an injection nozzle 54 placed below the spray nozzle 52. The spray nozzle 52 and the spray nozzle or injection nozzle 53 are similar to the spray nozzles 52 and the spray nozzle or injection nozzle 53 placed in the shower tank 51a on the first stage and are configured to receive a supply of the liquid from the fluid flow path 72b. The injection nozzle 54 is configured to receive a supply of the liquid from the fluid flow path 72a and to inject and beat the liquid against the liquid surface in the liquid tank 42c. The processing gas from the shower tank 51a is flowed downward in the shower tank 51b and is flowed from a lower end portion of the shower tank 51b into the shower tank 51c on a third stage. While the processing gas passes through the shower tank 51b, the processing gas is exposed to or comes into contact with the liquid sprayed or injected from the spray nozzle 52, from the spray nozzle or injection nozzle 53 and from the injection nozzle 54, so as to be hydrolyzed. Injecting the liquid from the injection nozzle 54 enables the product floating on the liquid surface in the liquid tank 42c to be stirred and dissolved in the liquid.

The shower tank 51c on the last stage includes two Raschig ring layers 57 placed to be aligned vertically, a spray nozzle 55 configured to spray the liquid toward the Raschig ring layer 57 on the lower side, and a spray nozzle 56 configured to spray the liquid toward the Raschig ring layer 57 on the upper side. A mist trap 61 is connected with an upper end of the shower tank 51c, and the processing gas is discharged from an exhaust port 62 via the mist trap 61. The Raschig ring layers 57 serve to prevent generation of mist and are formed by piling or stacking a large number of resin rings. The spray nozzle 55 is configured to receive a supply of the liquid from the fluid flow path 72b and spray the liquid downward toward the Raschig ring layer 57 on the lower side. The spray nozzle 56 is configured to receive a supply of fresh water (for example, city water) from a liquid flow path (water flow path) 63 and spray the liquid downward toward the Raschig ring layer 57 on the upper side. A flowmeter 64 is provided in the liquid flow path 63, and a supply amount of fresh water to the spray nozzle 56 is controlled, based on a detection value of the flowmeter 64. The mist trap 61 includes one or a plurality of baffle plates and serves to remove the moisture from the processing gas in the form of mist and discharge the processing gas in the gaseous state. The processing gas from the shower tank 51b is flowed upward in the shower tank 51c, is exposed to or comes into contact with the liquid sprayed from the spray nozzle 55 and from the spray nozzle 56, so as to be further hydrolyzed, is returned to the gaseous state in the mist trap 61 and is discharged from the exhaust port 62.

The exhaust gas processing apparatus 10 of the embodiment is provided with a pump 81 configured to pressure-feed the liquid discharged from the liquid outlet 43 of the liquid tank 42c. Fluid flow paths (water flow paths) 71 and 72 connected with the pump 81 may be provided with a removal mechanism (not shown) to remove the foreign substance and the like included in the liquid. The pump 81 serves to supply the liquid discharged from the liquid outlet 43 through the fluid flow paths 72 and 72a to the spray nozzles 46 and 52 and to the injection nozzle 54. The pump 81 also serves to supply the liquid discharged from the liquid outlet 43 through the fluid flow paths 72 and 72b to the spray nozzles 52, to the spray nozzle or injection nozzles 53, to the spray nozzle 55. The pump 81 further serves to supply the liquid discharged from the liquid outlet 43 through the fluid flow paths 72 and 72c to the liquid film forming portion 26 of the suction casing 20. Reusing the liquid stored in the liquid tanks 42a to 42c as described above reduces the running cost and contributes to the environmental conservation.

The fluid flow path (water flow path) 72c is provided with a flowmeter 83. Controlling the pump 81 based on a detection result of the flowmeter 83 regulates the flow rate of the liquid to the liquid film forming portion 26 and appropriately controls the thickness of the liquid film Lf and the like. For example, the thickness of the liquid film Lf is controlled, such as to reduce a pressure loss of the processing gas and suppress scattering of the product. The flowmeter 83 may be a flow control valve having a function of controlling the flow rate in addition to a function of detecting the flow rate. For example, a CLC (Closed Loop Controller) may be employed to automatically control the flow control valve such as to make the flow rate equal to a set value based on a detection value of the flowmeter. The fluid flow path 72 may be provided with a flowmeter 82 to monitor and control the overall flow rate of the liquid from the pump 81. Like the flowmeter 83, the flowmeter 82 may be configured to have the function of controlling the flow rate.

The liquid discharged from the liquid outlet 43 by the pump 81 is discharged through the fluid flow path 71 out of the exhaust gas processing apparatus 10, in response to opening/closing of a drain valve 84 provided in the fluid flow path 71. In one example, the pump 81 is continuously operated to circulate the liquid in the course of processing of the processing gas. The opening/closing of the drain valve 84 is controlled, such that the water level in the liquid tank 42c is kept in a predetermined range (a range of not less than a predetermined first reference value and less than a predetermined second reference value).

According to the embodiment described above, the outlet 24 is arranged to be separate from the liquid surface in the liquid tank 42a. This configuration reduces a pressure loss of the processing gas flowing out from the outlet 24, enhances the flow rate of the processing gas, and enhances the processing speed of the exhaust gas processing apparatus. The outlet 24 is arranged to be close to the liquid surface of the stored liquid. This configuration suppresses scattering of the product to the periphery.

According to the embodiment, the liquid tank 42a is the overflow-type liquid tank. This configuration stabilizes the height of the liquid surface immediately below the outlet 24 and suppresses an increase in pressure loss of the processing gas and scattering of the product.

According to the embodiment, the spray nozzles 46 serve to spray the liquid over the entire inside of the liquid tank 42a (the entire configuration above the liquid surface) and enables the interface in the liquid tank 42a to be covered with the liquid. This suppresses the product from adhering to the configuration in the liquid tank 42a. Furthermore, the spray nozzles 46 serve to spray the liquid to the peripheral part of the outlet 24 of the suction casing 20. This enables the product produced by the reaction of the processing gas with the liquid in the vicinity of the outlet 24 of the suction casing 20 to be dropped down into the stored liquid. This configuration suppresses scattering of the product from the vicinity of the outlet 24 of the suction casing 20. Moreover, the liquid of the liquid film Lf formed by the liquid film forming portion 26 of the suction casing 20 flows out of the outlet 24. This configuration also suppresses scattering of the product in the outlet 24.

Modification

Figure 2:
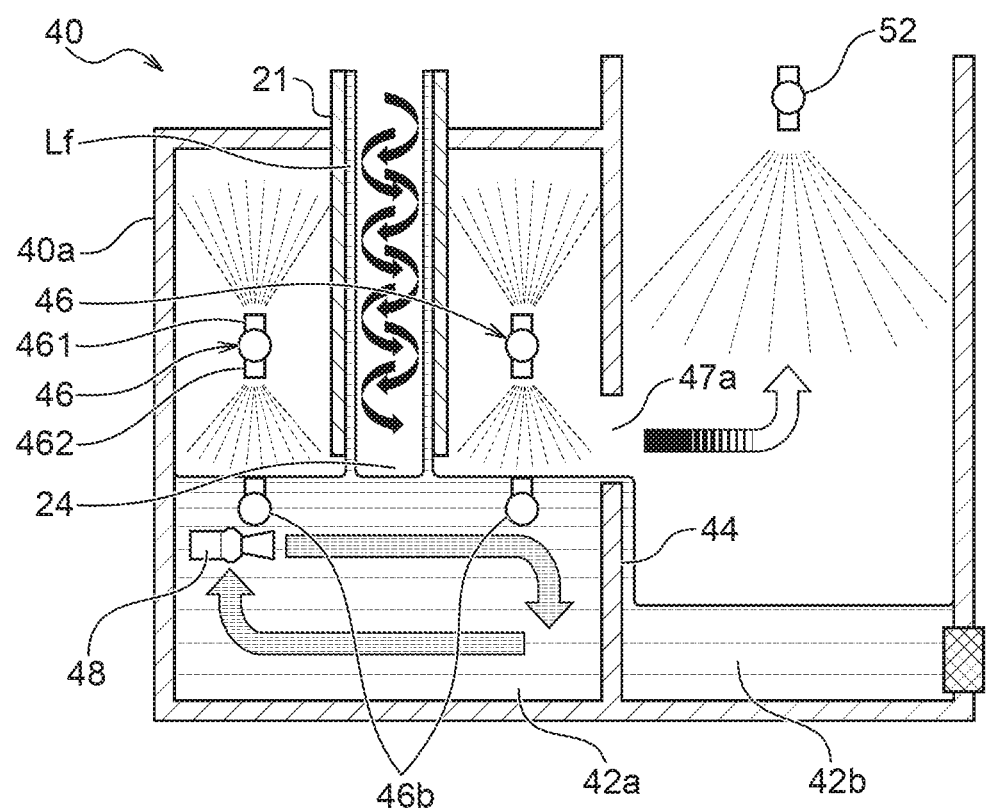
FIG. 2 is a diagram illustrating the configuration of an exhaust gas processing apparatus in a liquid tank according to a modification.

FIG. 2 is a diagram illustrating the configuration of an exhaust gas processing apparatus in a liquid tank according to a modification. In this illustrated example, one or multiple spray nozzles 46b are additionally placed in the vicinity of the liquid surface of the stored liquid in the liquid tank 42a. In the one or multiple spray nozzles 46b, only its discharge opening is exposed on the liquid surface to spray the liquid toward the outlet 24 of the suction casing 20. The spray nozzle 46b has only its discharge opening exposed on the liquid surface and a remaining part other than the discharge opening submerged in the liquid. This configuration suppresses adhesion of the product. Furthermore, the liquid is discharged from the discharge opening of the spray nozzle 46b. This suppresses adhesion of the product at the discharge opening.

With a view to spraying the liquid around the whole circumference of the outlet 24, it is preferable to arrange a plurality of spray nozzles 46b around the outlet 24. During stop or during continuation of the spray of the liquid from the spray nozzles 46, this configuration causes the liquid to be discharged from the spray nozzles 46b toward the spray nozzles 46, such as to clean the spray nozzles 46 and thereby suppress adhesion of the product to the spray nozzles 46 or such as to wash away the product adhering to the spray nozzles 46 and thereby reduce the volume of the product adhering to the spray nozzles 46. Furthermore, this configuration causes the liquid to be sprayed from around the outlet 24 of the suction casing 20 to the outlet 24 of the suction casing 20 by the spray nozzles 46b, such as to clean the peripheral part of the outlet 24 and thereby further suppress adhesion of the product to the peripheral part of the outlet 24.

The configuration of FIG. 2 may be further modified to spray the liquid upward from the spray nozzles 46b with omission of the second spray nozzles of spraying the liquid downward out of the spray nozzles 46. This further modification also enables the spray nozzles 46b to spray the liquid to the peripheral part of the outlet 24 of the suction casing 20.

Second Embodiment

Figure 3:
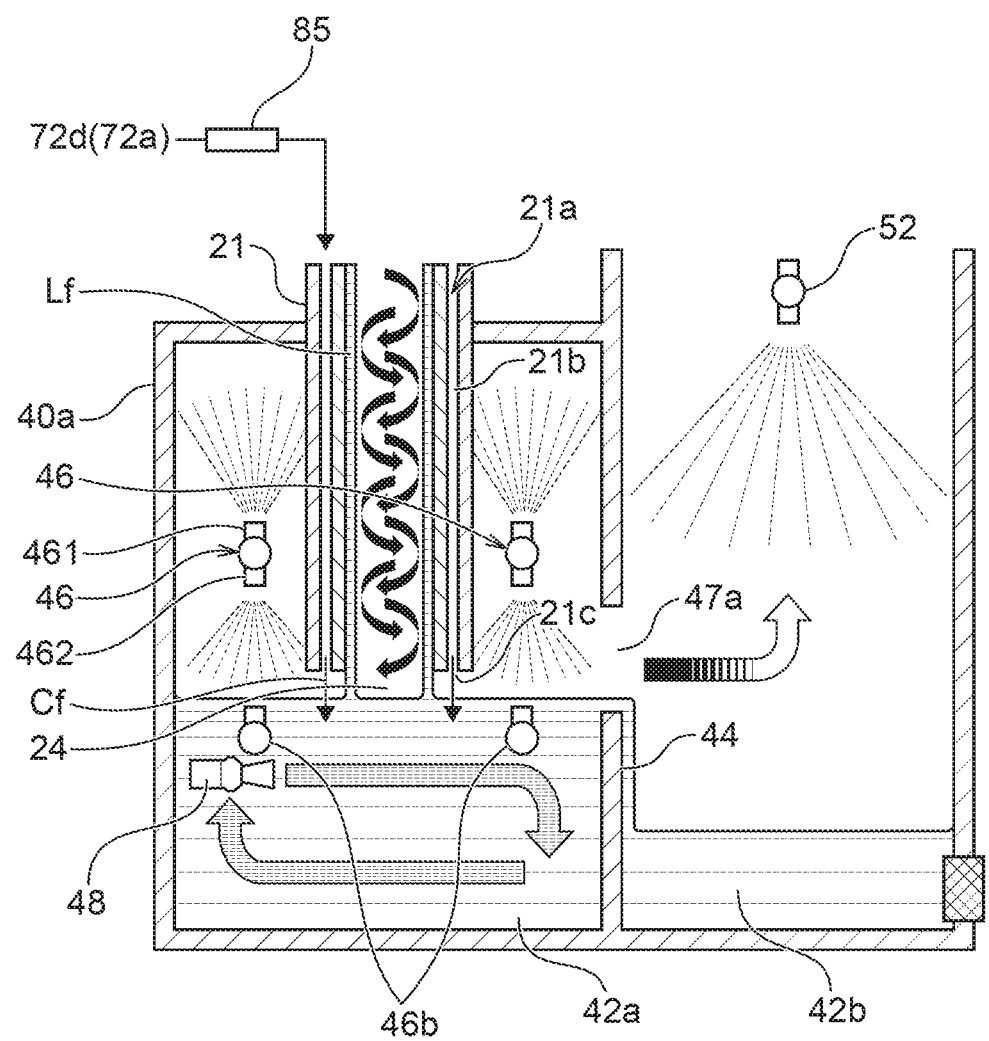
FIG. 3 is a diagram illustrating the configuration of an exhaust gas processing apparatus in a liquid tank according to a second embodiment.

FIG. 3 is a diagram illustrating the configuration of an exhaust gas processing apparatus in a liquid tank according to a second embodiment. The following describes a configuration different from the first embodiment with omission of the description on a similar configuration to the first embodiment. According to an exhaust gas processing apparatus 10 of this embodiment, in a liquid tank 42a a liquid film forming portion (water wall forming section) 21a is provided inside of a wall of a piping 21 of a suction casing 20. The liquid film forming portion 21a includes a passage 21b of the liquid that is provided inside of the wall of the piping 21 of the suction casing 20 and an opening 21c that is open to a lower end face of the piping 21.

For example, when the piping 21 of the suction casing 20 has a double pipe structure, the passage 21b may be formed by a space between an inner pipe and an outer pipe. The passage 21b is, however, not limited to this configuration, but may be configured by machining the piping 21 of the suction casing 20 to form a hole and/or a slit or may employ any other configuration. The passage 21b may be configured as a reservoir to store the liquid therein while discharging the liquid from the opening 21c. The opening 21c may be a plurality of holes or slits provided around the whole circumference in an end face or may be a continuous slit around the whole circumference. The liquid is supplied from, for example, a fluid flow path 72a branched off from the fluid flow path 72 (as shown in FIG. 1) or from an individual fluid flow path branched off from the fluid flow path 72 to the passage 21b inside of the wall of the piping 21 of the suction casing 20.

The liquid supplied to the passage 21b inside of the wall of the piping 21 flows down in the passage 21b and flows downward out of the opening 21c in an end face of the piping 21 to form a curtain-like liquid film Cf. As a result, an outlet 24 is surrounded in double by a liquid film Lf formed on the inner wall surface of the suction casing 20 and the curtain-like liquid film Cf outside of the liquid film Lf. This configuration further suppresses scattering of the product from the vicinity of the outlet 24. An end face of the suction casing 20 is sufficiently wetted with the liquid sprayed downward from the spray nozzles 46 and with the liquid of the curtain-like liquid film Cf flowing out from the lower end face of the piping 21. This configuration further suppresses the product from adhering to the peripheral part of the outlet 24.

A flowmeter 85 may be provided in a fluid flow path 72d (72a) connected with the liquid film forming portion 21a. The flow rate of the liquid that is to be supplied to the liquid film forming portion 21a may be controlled, based on a detection value of the flowmeter 85, such as to provide an appropriate thickness of the curtain-like liquid film Cf. The configuration of the flowmeter 85 may have the function of controlling the flow rate, like the configuration of the flowmeter 83 described above. A configuration of connecting an individual fluid flow path 72d with the liquid film forming module 21a controls the flow rate of the liquid to the liquid film forming portion 21a with high accuracy, while reducing or eliminating the effect onto the flow rates of the other spray nozzles.

The configuration of FIG. 3 is provided with spray nozzles 46b like the modification of the first embodiment. The spray nozzles 46b may, however, be omitted from the configuration of FIG. 3. The configuration of FIG. 3 may be further modified to spray the liquid upward from the spray nozzles 46b with omission of the second spray nozzles 462 of spraying the liquid downward out of the spray nozzles 46. This further modification also enables the spray nozzles 46b to spray the liquid to the peripheral part of the outlet 24 of the suction casing 20.

In place of or in addition to the opening 21c of the liquid film forming portion 21a provided in the end face of the piping 21 of the suction casing 20, an opening 21c of the liquid film forming portion 21a may be provided in a side face of the piping 21 of the suction casing 20. This modified configuration also enables a curtain-like liquid film to be formed outside of the liquid film Lf by making the flow of the liquid from the opening 21c in the side face of the piping 21 of the suction casing 20 along the outer surface of the piping 21.

Third Embodiment

Figure 5:
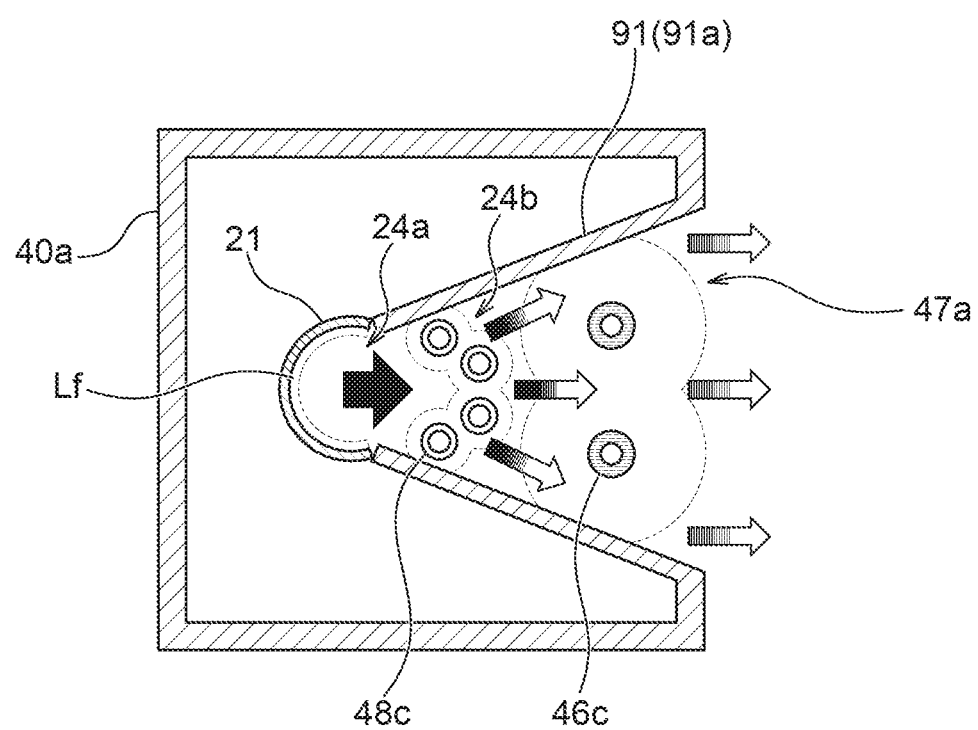
FIG. 5 is a plan view illustrating the configuration of the exhaust gas processing apparatus in the liquid tank according to the third embodiment.
Figure 6:
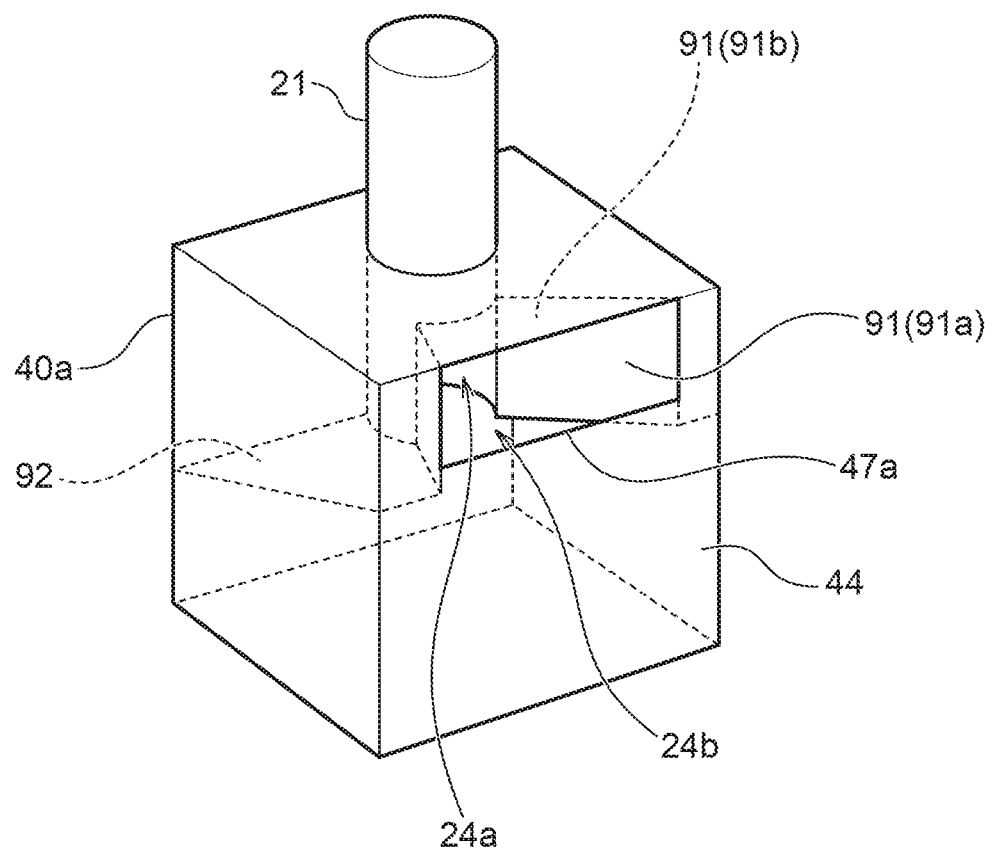
FIG. 6 is a perspective view illustrating the configuration of the exhaust gas processing apparatus in the liquid tank according to the third embodiment.
Figure 7:
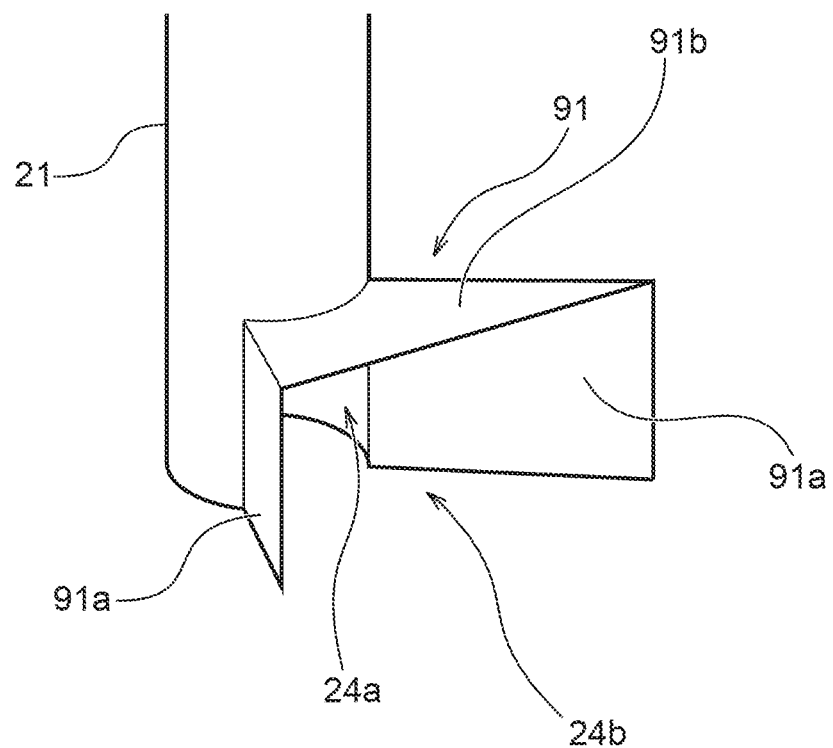
FIG. 7 is a perspective view illustrating a suction casing in the exhaust gas processing apparatus according to the third embodiment.

FIGS. 4 to 7 illustrate the configuration of an exhaust gas processing apparatus in a liquid tank according to a third embodiment. The following describes a configuration different from the above embodiments with omission of the description on a similar configuration to the first embodiment. According to this embodiment, as shown in FIG. 7, an outlet 24a is formed by providing a cut in part of a piping 21 at a lower end of a suction casing 20. A duct 91 is also provided to be laterally extended continuously from the outlet 24a. The duct 91 includes side plates (side panel) 91a provided on respective sides and a top plate (top panel) 91b provided continuously from upper end portions of the side plates 91a on the respective sides. A duct passage 24b is formed inside of the side plates 91a and the top plate 91b. The duct passage 24b is formed to have a sectional shape that is gradually expanded from the outlet 24a to a downstream side. According to the embodiment, the duct passage 24b has a rectangular sectional shape but may have another sectional shape, for example, an elliptical sectional shape.

Figure 4:
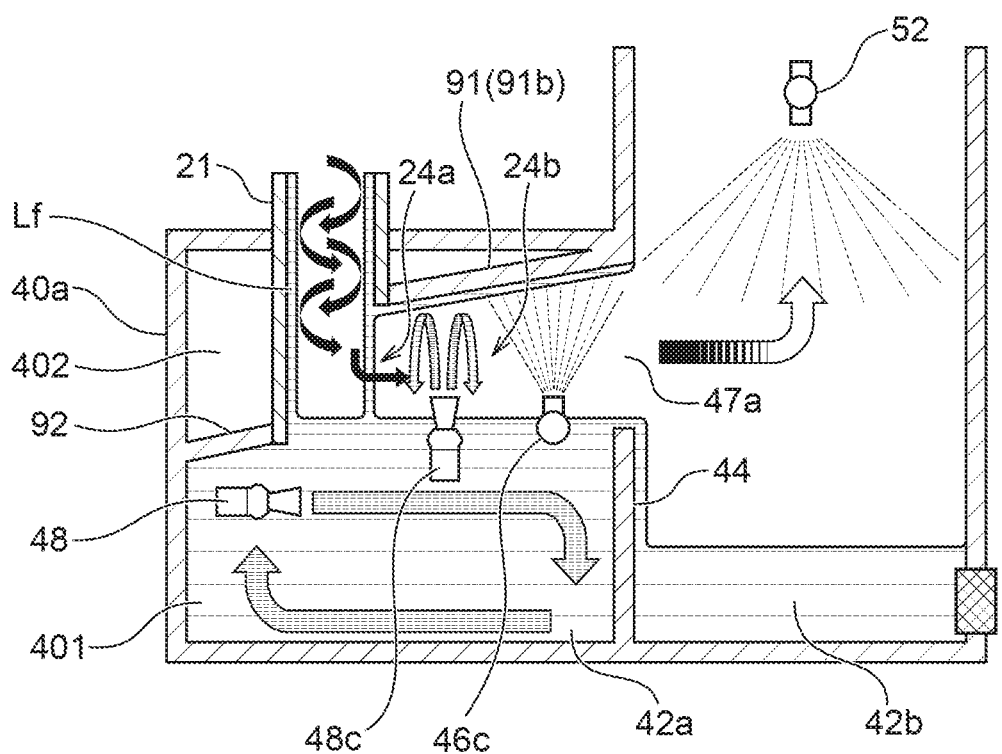
FIG. 4 is a side view illustrating the configuration of an exhaust gas processing apparatus in a liquid tank according to a third embodiment.

The top plate 91b of the duct 91 is sloped upward from the outlet 24a toward the downstream side (as shown in FIG. 4), and the left and right side plates 91a are sloped outward from the outlet 24a toward the downstream side (as shown in FIG. 5). As shown in FIG. 4, a lower end of the suction casing 20 (piping 21) is placed below an upper end of a weir 44. In other words, the lower end of the suction casing 20 is placed below the liquid surface of the stored liquid in a liquid tank 42a. Like the embodiments described above, the liquid tank 42a is an overflow-type liquid tank provided with the weir 44. This configuration stabilizes the height of the liquid surface immediately below the outlet 24a and suppresses an increase in pressure loss of the processing gas and scattering of the product.

A partition plate (partition panel) 92 is provided continuously from a lower end of the duct (as shown in FIG. 4 and FIG. 6). The partition plate 92 is provided to be continuous outward from the entire circumference of the lower end of the duct 91 and the suction casing 20 and is extended continuously from the entire area of the inner circumference of the liquid tank 42a except the part of the duct passage 24b. This configuration causes the duct 91 and the partition plate 92 to part the liquid tank 42a into an upper space and a lower space and to separate the upper space and the lower space in fluid from each other. As shown in FIG. 4, a lower space 401 below the partition plate 92 to a lower face of the partition plate 92 is filled with the liquid, and the duct passage 24b inside of the duct 91 is surrounded by the duct 91 and the liquid surface. An upper space 402 above the partition plate 92 is separated in fluid from the lower space 401, so that neither the processing gas nor the liquid enters the upper space 402. The liquid tank 42a is the overflow type. This stabilizes the liquid surface in the liquid tank 42a and suppresses a clearance from being formed between the partition plate 92 and the liquid surface. This configuration accordingly suppresses the processing gas from coming into contact with the lower face of the partition plate 92 and thereby suppresses adhesion of the product. When the processing gas is unlikely to be leaked out of the duct 91 via the stored liquid, the partition plate 92 may be omitted.

In the duct passage 24b, one or multiple spray nozzles 46c and one or multiple eductors 48c are provided in the vicinity of the liquid surface. The one or multiple spray nozzles 46c may be replaced by eductors, and all the components 46c and 48c may be provided as eductors. The one or multiple eductors 48c may be replaced by spray nozzles, and all the components 46c and 48cc may be provided as spray nozzles. Respective discharge openings of the spray nozzles 46c and the eductors 48c are exposed on the liquid surface and are directed to discharge the liquid upward. Large parts of the spray nozzles 46c and the eductors 48c other than their discharge openings are submerged in the liquid. This configuration accordingly suppresses the product from adhering to the spray nozzles 46c and the eductors 48c.

In this illustrated example, as shown in FIG. 5, four eductors 48c are arranged in a direction crossing the duct passage 24b on a side close to the outlet 24a, and two spray nozzles 46c are arranged in the direction crossing the duct passage 24b on a downstream side of the eductors 48c. The four eductors 48c are also arranged to be located on the more downstream side at positions closer to the center of the duct passage 24b. This arrangement enables a larger number of eductors to be placed in the duct passage 24b. The plurality of spray nozzles 46c may be arranged to be located on the more downstream side at positions closer to the center of the duct passage 24b. The numbers and the arrangements of the eductors 48c and the spray nozzles 46c are only illustrative, and other numbers and other arrangements may be employed.

The eductors 48c are configured to inject the liquid toward the inside of the duct passage 24b and the inner wall surface of the duct passage 24b, so as to hydrolyze the processing gas passing through the duct passage 24b with the liquid, to drop down the product into the stored liquid by the injected liquid, and to cover over the entire inner wall surface of the duct passage 24b with the liquid. The spray nozzles 46c are configured to spray the liquid toward the inside of the duct passage 24b and the inner wall surface of the duct passage 24b, so as to hydrolyze the processing gas passing through the duct passage 24b with the liquid, to drop down the product into the stored liquid by the sprayed liquid, and to cover over the entire inner wall surface of the duct passage 24b with the liquid. The top plate 91b of the duct 91 is provided to slope down toward the outlet 24a as shown in FIG. 4. The liquid from the spray nozzles 46c reaching a lower face of the top plate 91b accordingly flows along the lower face of the top plate 91b toward the outlet 24a, so that the lower face of the top plate 91b is covered with the liquid.

This embodiment is configured to part the inside of the liquid tank 42a into the upper space and the lower space by the duct 91 and the partition plate 92 and introduce the liquid and the processing gas into the lower space 401. Accordingly, entirely covering over the inside of the lower space 401 with the liquid suppresses adhesion of the product. This configuration narrows an area where the liquid is sprayed from the spray nozzles, and reduces the use amount of the liquid. This configuration also reduces the number of spray nozzles. The flow of the processing gas is limited to the inside of the duct passage 24b. This configuration enables the processing gas to be readily exposed to or come into contact with the liquid from the eductors and/or from the spray nozzles and thus improves the efficiency of hydrolysis of the processing gas. The duct passage 24b has a small flow sectional area on the side close to the outlet 24a where the processing gas is especially concentrated. Therefore, injecting the liquid from the eductors 48c accordingly enables the processing gas to be effectively exposed to or come into contact with the liquid and accelerates hydrolysis of the processing gas.

According to the embodiment, the outlet 24a is opened laterally on the liquid surface. This configuration reduces a pressure loss of the processing gas, enhances the flow rate of the processing gas and enhances the processing speed of the exhaust gas processing apparatus. Furthermore, the outlet 24a is surrounded by the duct 91 and the liquid surface. This configuration suppresses scattering of the product. Moreover, the inside of the liquid tank 42a is parted in fluid into the lower space 401 and the upper space 402, and only the inside of the duct 91 is exposed on the stored liquid in the lower space 401 where the outlet 24a is placed. Therefore, only covering over the inner wall of the duct 91 with the liquid suppresses adhesion of the product in the liquid tank 42a.

At least the following aspects are provided from the embodiments described above.

According to a first aspect, there is provided an exhaust gas processing apparatus configured to cause a processing gas to be exposed to or come into contact with a liquid and thereby detoxify the processing gas. The exhaust gas processing apparatus comprises a suction casing provided with an inlet which the processing gas is sucked into and with an outlet which the processing gas is flowed out from; a liquid tank configured to receive an outlet-side part of the suction casing and store the liquid therein; and one or multiple spray nozzles placed in the liquid tank. The outlet of the suction casing is arranged to be located above a liquid surface of the liquid stored in the liquid tank. The one or multiple spray nozzles are configured to spray the liquid from around the outlet of the suction casing to a peripheral part of the outlet.

In the exhaust gas processing apparatus of this aspect, the outlet of the suction casing is located above the liquid surface of the liquid in the liquid tank. This configuration reduces a pressure loss of the processing gas that is discharged from the suction casing into the liquid tank, compared with a configuration that the outlet is located below the liquid surface and that the processing gas is discharged into the liquid. This configuration thus enhances the processing speed of the processing gas in the exhaust gas processing apparatus.

This configuration sprays the liquid from around the outlet of the suction casing to the periphery of the outlet and thereby suppresses a product from adhering to a terminal end of the suction casing in the vicinity of the outlet of the processing gas where the product is likely to be produced. This configuration also enables the product produced in the vicinity of the outlet to be dropped down into the liquid in the liquid tank by the sprayed liquid and thereby suppresses the product from floating.

According to a second aspect, in the exhaust gas processing apparatus of the first aspect, the one or multiple spray nozzles may be configured such that an entire surface in the liquid tank, which includes an outer surface of the suction casing above the liquid surface in the liquid tank and a wall of the liquid tank, is covered with the sprayed liquid.

The configuration of this aspect enables the inside of the liquid tank to be entirely covered with the liquid. This configuration suppresses the product from adhering to the configuration inside of the liquid tank (wall surface of the liquid tank and the suction casing). In other words, all interfaces in the liquid tank are covered with the liquid. This suppresses adhesion of the product to any interface in the liquid tank. The interface herein means an exposed location or portion of the apparatus that is not covered with the liquid in the vicinity of the liquid where a product is produced, and may be called a gas liquid interface. A product produced by a reaction of the processing gas with the liquid is likely to adhere to such an interface. As described above, the configuration of this aspect, however, effectively suppresses adhesion of the product to any interface in the liquid tank.

According to a third aspect, in the exhaust gas processing apparatus of either the first aspect or the second aspect, the liquid tank may have a weir provided to make a flow of overflowing liquid to a downstream side, and the outlet of the suction casing may be located above the weir.

The configuration of this aspect enables the liquid surface in the liquid tank to be stably kept at a height near to an upper end of the weir and enables the distance between the outlet and the liquid surface to be readily kept constant. This configuration suppresses the outlet from excessively approaching to or coming into contact with the liquid surface due to a rise of the liquid surface and thereby suppresses an increase in the pressure loss of the discharged processing gas. This configuration also suppresses the outlet from excessively being away from the liquid surface due to a fall of the liquid surface and thereby suppresses an increase in scattering of the product to the periphery.

According to a fourth aspect, in the exhaust gas processing apparatus of any one of the first to the third aspects, the one or multiple spray nozzles may comprise a first nozzle placed above the outlet of the suction casing and configured to spray the liquid upward; and a second nozzle placed above the outlet of the suction casing and configured to spray the liquid downward.

The configuration of this aspect enables the liquid to be sprayed from the first nozzle to the outer surface of the suction casing and the wall of the liquid tank, while enabling the liquid to be sprayed from the second nozzle to the peripheral part of the outlet of the suction casing. This configuration accordingly enables the entire interface in the liquid tank to be covered with the liquid and thereby suppresses adhesion of the product to the interface. This configuration also suppresses the product from adhering to the terminal end of the suction casing in the vicinity of the outlet of the processing gas where the product is likely to be produced. This configuration also enables the product produced in the vicinity of the outlet from being dropped down into the liquid in the liquid tank and thereby suppresses the product from floating.

According to a fifth aspect, in the exhaust gas processing apparatus of any one of the first to the third aspects, the one or multiple spray nozzles may comprise a first nozzle placed above the outlet of the suction casing and configured to spray the liquid upward; and a second nozzle placed above the outlet of the suction casing and configured to spray the liquid downward and/or a third nozzle placed below the outlet of the suction casing and configured to spray the liquid upward.

The configuration of this aspect uses the first nozzle and the second nozzle and/or the third nozzle and has similar functions and advantageous effects to those of the fourth aspect described above. During stop or during continuation of the spray of the liquid from the second nozzle, the liquid is sprayed from the third nozzle toward the first nozzle and/or the second nozzle. This suppresses the product from adhering to the first nozzle and/or the second nozzle. Furthermore, the configuration of spraying the liquid upward from the lower location by the third nozzle enables the end face of the suction casing to be readily covered with the liquid.

According to a sixth aspect, in the exhaust gas processing apparatus of any one of the first to the fourth aspects, the suction casing may comprise a first liquid film forming portion provided inside of a wall of the suction casing and configured to form a curtain-like liquid film around the outlet.

The configuration of this aspect forms a curtain-like liquid film around the outlet and enables the product to be dropped down into the liquid by the curtain-like liquid film. This further suppresses scattering of the product. When a second liquid film forming portion is further provided to form a liquid film on an inner face of the suction casing, the product can be dropped down into the liquid by double curtain-like liquid films, i.e., a curtain-like liquid film that passes through the inner face of the suction casing and flows out from the outlet and a curtain-like liquid film that flows out from the inside of the wall of the suction casing to the periphery of the outlet. This furthermore suppresses scattering of the product.

According to a seventh aspect, in the exhaust gas processing apparatus of the sixth aspect, the suction casing may have a double pipe structure. The first liquid film forming portion may include a liquid passage that is provided between an inner pipe and an outer pipe; and an opening that is in fluid communication with the liquid passage and that is open to an end face or a side wall of the suction casing.

The configuration of this aspect enables the first liquid film forming portion to be provided by the simple structure.

According to an eighth aspect, the exhaust gas processing apparatus of the seventh aspect may further comprise a flowmeter and/or a flow control valve configured to measure a flow rate of the liquid that is to be supplied to the first liquid film forming portion.

The configuration of this aspect enables the supply amount of the liquid by the first liquid film forming portion to be controlled with high accuracy and enables the flow rate of the liquid of the curtain-like liquid film and/or the thickness of the curtain-like liquid film to be regulated with high accuracy.

According to a ninth aspect, the exhaust gas processing apparatus of any one of the first to the eighth aspects may further comprise a second liquid film forming portion provided between the inlet and the outlet of the suction casing and configured to form a liquid film on an inner wall surface of the suction casing.

The configuration of this aspect suppresses the product from adhering to the inner face of the suction casing (wall surface of the processing gas flow path). When the first liquid film forming portion is provided inside of the wall of the suction casing, the product can be dropped down into the liquid by double curtain-like liquid films, i.e., a curtain-like liquid film that passes through the inner face of the suction casing and flows out from the outlet and a curtain-like liquid film that flows out from the inside of the wall of the suction casing to the periphery of the outlet. This further suppresses scattering of the product.

According to a tenth aspect, in the exhaust gas processing apparatus of any one of the first to the ninth aspects, the suction casing may be arranged such that the outlet is located close to the liquid surface of the liquid in the liquid tank.

In the exhaust gas processing apparatus of this aspect, the outlet is located above and close to the liquid surface. This configuration suppresses scattering of the product, while reducing a pressure loss of the processing gas.

According to an eleventh aspect, in the exhaust gas processing apparatus of any one of the first to the tenth aspects, a plurality of the spray nozzles may be arranged around the suction casing.

In the exhaust gas processing apparatus of this aspect, the entire inside of the liquid tank (the entire walls of the suction casing and the liquid tank) are more effectively covered with the liquid by arranging an adequate number of the spray nozzles and/or by arranging the spray nozzles at adequate intervals around the suction casing.

According to a twelfth aspect, the exhaust gas processing apparatus of any one of the first to the eleventh aspects may further comprise an eductor provided in the liquid tank and configured to stir the liquid stored in the liquid tank.

The configuration of this aspect stirs the liquid in the liquid tank to dissolve the product in the liquid and thereby suppresses retention or accumulation of the product in the liquid.

According to a thirteenth aspect, there is provided an exhaust gas processing apparatus configured to cause a processing gas to be exposed to or come into contact with a liquid and thereby detoxify the processing gas. The exhaust gas processing apparatus comprises a suction casing provided with an inlet which the processing gas is sucked into and with an outlet which is provided below the inlet and which the processing gas is flowed out from; a liquid tank configured to receive an outlet-side part of the suction casing and store the liquid therein; a liquid film forming portion provided between the inlet and the outlet of the suction casing and configured to form a liquid film on an inner wall surface of the suction casing; and one or multiple liquid supply devices placed in the liquid tank and configured to inject or spray the liquid. The suction casing is arranged such that a terminal end of the suction casing is located below a liquid surface of the liquid in the liquid tank. The suction casing is provided with the outlet in a side wall on a terminal end side of the suction casing. A duct is provided in the liquid tank to guide the processing gas from the outlet of the suction casing toward a downstream side. The one or multiple liquid supply devices are arranged to inject or spray the liquid toward inside of the duct and a wall surface of the duct.

In the exhaust gas processing apparatus of this aspect, the outlet is open laterally on or above the liquid surface. This configuration reduces a pressure loss of the processing gas, enhances the flow rate of the processing gas, and enhances the processing speed of the exhaust gas processing apparatus. The outlet is surrounded by the duct and the liquid surface. This configuration suppresses scattering of the product. Moreover, the configuration that the outlet of the suction casing is surrounded by the liquid surface and the duct limits the flow of the processing gas into the passage defined by the liquid surface and the duct. Accordingly, when the liquid is injected or sprayed toward the inside of the duct and the wall surface of the duct by the one or multiple liquid supply devices, the processing gas is effectively exposed to or comes into contact with the liquid. This accelerates hydrolysis of the processing gas. In addition, only covering the wall surface of the passage surrounded by the duct with the liquid can suppress adhesion of the product in the liquid tank.

Furthermore, the liquid film is formed on the inner face of the suction casing by the liquid film forming portion. This configuration causes the outlet provided in the side wall of the suction casing to be covered with the curtain-like liquid film and suppresses the product from adhering to the vicinity of the outlet.

According to a fourteenth aspect, in the exhaust gas processing apparatus of the thirteenth aspect, the liquid tank may have a weir provided to make a flow of overflowing liquid to the downstream side, and the terminal end of the suction casing may be located below an upper end of the weir.

The configuration of this aspect enables the liquid surface in the liquid tank to be stably kept at a height near to the upper end of the weir and enables the distance between the outlet and the liquid surface to be readily kept constant. This configuration suppresses a reduction of the flow area of the outlet exposed on the liquid surface and suppresses a resulting increase in pressure loss, due to a rise of the liquid surface. Furthermore, this configuration suppresses a clearance from being generated between the outlet and the liquid surface due to a fall of the liquid surface, and thereby suppresses the processing gas from being directly released through the clearance out of the duct and suppresses an increase in scattering of the product from the periphery of the outlet to outside of the duct.

According to a fifteenth aspect, the exhaust gas processing apparatus of either the thirteenth aspect or the fourteenth aspect may further comprise a partition plate formed continuously from whole circumferences of a lower end of the suction casing and of a lower end of the duct and configured to part inside of the liquid tank into an upper space and a lower space.

In the exhaust gas processing apparatus of this aspect, the inside of the liquid tank is parted in fluid into the upper space and the lower space by the partition plate. Only the inside of the duct is exposed on the stored liquid in the lower space where the outlet is placed. Forming a liquid film on an inner wall of the duct suppresses adhesion of the product in the liquid tank. The configuration of this aspect also suppresses the processing gas from being released out of the duct via the stored liquid.

According to a sixteenth aspect, in the exhaust gas processing apparatus of any one of thirteenth to fifteenth, a plurality of the liquid supply devices may be arranged to cross in a flow direction of the processing gas.

The configuration of this aspect enables the entire passage of the processing gas in the duct to be suitably covered with the liquid. This configuration also enables the processing gas in the duct to be effectively exposed to or come into contact with the liquid and thereby accelerates hydrolysis of the processing gas.

According to a seventeenth aspect, in the exhaust gas processing apparatus of any one of the thirteenth to the sixteenth aspects, the one or multiple liquid supply devices include an eductor and/or a spray nozzle.

The configuration of this aspect enables the passage of the processing gas in the duct to be suitably covered with the liquid by the simple structure.

The present application claims priority from the Japanese patent application No. 2019-152118 filed on Aug. 22, 2019. The entire disclosure of the Japanese patent application No. 2019-152118 filed on Aug. 22, 2019, including the specification, the claims, the drawings and the abstract is incorporated herein by reference in its entirety. The entire disclosures of Japanese Unexamined Patent Publication No. 2003-251130 (Patent Document 1) and Japanese Unexamined Patent Publication No. 2015-379 (Patent Document 2), including the specifications, the claims, the drawings and the abstracts are incorporated herein by reference in their entireties. The entire disclosure of the Japanese patent application No. 2018-031823 filed on Feb. 26, 2018, including the specification, the claims, the drawings and the abstract is incorporated herein by reference in its entirety.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

REFERENCE SIGNS LIST

10 exhaust gas processing apparatus
11 cabinet
13 drain pan
14 liquid leakage sensor (water leak sensor)
20 suction casing
21 piping
21a liquid film forming portion (water wall forming section)
21b passage
21c opening
22 inlet
23 suction piping (inlet piping)
24 outlet
26 liquid film forming portion (water wall forming section)
31 wall portion
32 scraper
40 liquid tank casing (circulating water tank casing)
40a wall
41 water level gauge (water level sensor)
42a-42c liquid tanks (circulating water tanks)
43 liquid outlet (drain port)
44 weir
45 filter
46 spray nozzle
46b spray nozzle
46c spray nozzle
47 wall
47a opening
48 eductor
48b eductor
48c eductor
50 processing casing (reactor)
50a, 50b walls
51a-51c shower tanks
52 spray nozzle
53 spray nozzle or injection nozzle
54 injection nozzle 55 spray nozzle
56 spray nozzle
57 Raschig ring layer
61 mist trap
62 exhaust port
63 liquid flow path (water flow path)
64 flowmeter
65 overpressure exhaust port
71, 72, 72a-72d fluid flow paths (water flow paths)
81 pump
82, 83, 85 flowmeters
84 drain valve
91 duct
91a side plate (side panel)
91b top plate (top panel)
92 partition plate (partition panel)
100 controller (control panel)
461 first spray nozzle
462 second spray nozzle

What is claimed is:

1. An exhaust gas processing apparatus configured to cause a processing gas to be exposed to or come into contact with a liquid and thereby detoxify the processing gas, the exhaust gas processing apparatus comprising:
    a suction casing provided with an inlet which the processing gas is sucked into and with an outlet which the processing gas is flowed out from;
    a liquid tank configured to receive an outlet-side part of the suction casing and store the liquid therein; and
    one or multiple spray nozzles placed in the liquid tank, wherein
    the outlet of the suction casing is arranged to be located above a liquid surface of the liquid stored in the liquid tank, and wherein
    the one or multiple spray nozzles are configured to spray the liquid from around the outlet of the suction casing to a peripheral part of the outlet.

2. The exhaust gas processing apparatus according to claim 1,
    wherein the one or multiple spray nozzles are configured such that an entire surface in the liquid tank, which includes an outer surface of the suction casing above the liquid surface in the liquid tank and a wall of the liquid tank, is covered with the sprayed liquid.

3. The exhaust gas processing apparatus according to either claim 1,
    wherein the liquid tank has a weir provided to make a flow of overflowing liquid to a downstream side, and
    the outlet of the suction casing is located above the weir.

4. The exhaust gas processing apparatus according to claim 1,
    wherein the one or multiple spray nozzles comprise:
        a first nozzle placed above the outlet of the suction casing and configured to spray the liquid upward; and
        a second nozzle placed above the outlet of the suction casing and configured to spray the liquid downward.

5. The exhaust gas processing apparatus according to claim 1,
    wherein the one or multiple spray nozzles comprise:
        a first nozzle placed above the outlet of the suction casing and configured to spray the liquid upward; and
        a second nozzle placed above the outlet of the suction casing and configured to spray the liquid downward and/or a third nozzle placed below the outlet of the suction casing and configured to spray the liquid upward.

6. The exhaust gas processing apparatus according to claim 1,
    wherein the suction casing comprises a first liquid film forming portion provided inside of a wall of the suction casing and configured to form a curtain-like liquid film around the outlet.

7. The exhaust gas processing apparatus according to claim 6,
    wherein the suction casing has a double pipe structure, and wherein
    the first liquid film forming portion includes a liquid passage that is provided between an inner pipe and an outer pipe; and an opening that is in fluid communication with the liquid passage and that is open to an end face or a side wall of the suction casing.

8. The exhaust gas processing apparatus according to claim 7, further comprising:
    a flowmeter and/or a flow control valve configured to measure a flow rate of the liquid that is to be supplied to the first liquid film forming portion.

9. The exhaust gas processing apparatus according to claim 1, further comprising:
    a second liquid film forming portion provided between the inlet and the outlet of the suction casing and configured to form a liquid film on an inner wall surface of the suction casing.

10. The exhaust gas processing apparatus according to claim 1,
    wherein the suction casing is arranged such that the outlet is located close to the liquid surface of the liquid in the liquid tank.

11. The exhaust gas processing apparatus according to claim 1,
    wherein a plurality of the spray nozzles are arranged around the suction casing.

12. The exhaust gas processing apparatus according to claim 1, further comprising:
    an eductor provided in the liquid tank and configured to stir the liquid stored in the liquid tank.

13. An exhaust gas processing apparatus configured to cause a processing gas to be exposed to or come into contact with a liquid and thereby detoxify the processing gas, the exhaust gas processing apparatus comprising:
    a suction casing provided with an inlet which the processing gas is sucked into and with an outlet which is provided below the inlet and which the processing gas is flowed out from;
    a liquid tank configured to receive an outlet-side part of the suction casing and store the liquid therein;
    a liquid film forming portion provided between the inlet and the outlet of the suction casing and configured to form a liquid film on an inner wall surface of the suction casing; and
    one or multiple liquid supply devices placed in the liquid tank and configured to inject or spray the liquid, wherein
    the suction casing is arranged such that a terminal end of the suction casing is located below a liquid surface of the liquid in the liquid tank, and
    the suction casing is provided with the outlet in a side wall on a terminal end side of the suction casing, and wherein a duct is provided in the liquid tank to guide the processing gas from the outlet of the suction casing toward a downstream side, and the one or multiple liquid supply devices are arranged to inject or spray the liquid toward inside of the duct and a wall surface of the duct, and a partition plate formed continuously from whole circumferences of a lower end of the suction casing and of a lower end of the duct and configured to part inside of the liquid tank into an upper space and a lower space.

14. The exhaust gas processing apparatus according to claim 13, wherein the liquid tank has a weir provided to make a flow of overflowing liquid to the downstream side, and the terminal end of the suction casing is located below an upper end of the weir.

15. The exhaust gas processing apparatus according to claim 13, wherein a plurality of the liquid supply devices are arranged to cross in a flow direction of the processing gas.

16. The exhaust gas processing apparatus according to claim 13, wherein the one or multiple liquid supply devices include an eductor and/or a spray nozzle.

* * * * *